(12) United States Patent
Kim et al.

(10) Patent No.: US 6,207,487 B1
(45) Date of Patent: Mar. 27, 2001

(54) METHOD FOR FORMING DIELECTRIC FILM OF CAPACITOR HAVING DIFFERENT THICKNESSES PARTLY

(75) Inventors: Yeong-kwan Kim, Seongnam; Sang-in Lee; Chang-soo Park, both of Suwon; Young-sun Kim, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/415,830

(22) Filed: Oct. 12, 1999

(30) Foreign Application Priority Data

Oct. 13, 1998 (KR) .................................. 98-42715

(51) Int. Cl.⁷ .............................................. H01L 21/8244
(52) U.S. Cl. ........................... 438/238; 438/239; 438/240
(58) Field of Search .................... 438/239, 240, 438/253, 254, 255, 396, 397, 398, 763, 793

(56) References Cited

U.S. PATENT DOCUMENTS

| | | | |
|---|---|---|---|
| 4,983,422 | * 1/1991 | Davis et al. | 427/228 |
| 5,141,603 | * 8/1992 | Dickey et al. | 205/124 |
| 5,374,570 | * 12/1994 | Nasu et al. | 437/40 |
| 5,385,863 | * 1/1995 | Tatsumi et al. | 437/109 |

FOREIGN PATENT DOCUMENTS 0 731 491 A2 * 9/1996 (DE) .

* cited by examiner

Primary Examiner—David Nelms
Assistant Examiner—David Vu
(74) Attorney, Agent, or Firm—Marger Johnson & McCollom, PC

(57) ABSTRACT

The present invention discloses a method for forming a dielectric film having improved leakage current characteristics in a capacitor. A lower electrode having a surface and a rounded protruding portion is formed on a semiconductor substrate. The surface and the protruding portion define at least one concave area. A chemisorption layer is then formed on the surface and the rounded protruding portion by supplying a first reactant. Also, a physisorption layer is formed on the chemisorption layer from the first reactant. Next, a portion of the physisorption layer is removed and a portion of the physisorption layer is left on the concave area. Subsequently, the chemisorption layer and the portion of the physisorption layer on the concave area react with a second reactant to form a dielectric film on the surface of the lower electrode. The thickness of said dielectric film is greater on the concave area than on the protruding portion, thereby reducing leakage current.

16 Claims, 6 Drawing Sheets

METHOD FOR FORMING DIELECTRIC FILM OF CAPACITOR HAVING DIFFERENT THICKNESSES PARTLY

BACKGROUND OF THE INVENTION

1. Field of the Invention

The present invention relates to a method for manufacturing a semiconductor device, and more particularly, to a method for forming a dielectric film of a capacitor.

2. Description of the Related Art

With the rapid increase in the integration level of semiconductor devices, the area of a unit memory cell has been reduced. Accordingly, it is necessary to form a capacitor having a sufficient cell capacitance for device operation.

The capacitance of a semiconductor memory device is an important factor which determines a memory capacity of the memory device. Reduced capacitance lowers the reading capability of a memory cell and increases a soft error rate. Therefore, in order to attain a highly integrated semiconductor memory device, a cell capacitance greater than a predetermined value must be obtained.

Various methods for increasing the capacitance within a limited cell area have been proposed. Among them, a typical method is to increase an effective area of a capacitor by increasing the electrode surface area by growing hemispherical grains (HSGs) to obtain a rugged surface of a lower electrode.

Generally, the capacitance of a capacitor is inversely proportionate to the thickness of a dielectric film and is directly proportionate to the contact area of the dielectric film with an electrode. Thus, it is necessary to minimize the thickness of the dielectric film and to maximize the contact area of the dielectric film with the electrode. To this end, when the dielectric film is formed on a lower electrode, it is important to obtain excellent step coverage.

Particularly, when the dielectric film is formed on the rugged surface of the lower electrode, in order to suppress leakage current while obtaining large capacitance, it is imperative to obtain excellent step coverage.

However, if a dielectric film is formed using a conventional chemical vapor deposition (CVD) or physical vapor deposition (PVD) method, it is difficult to gain excellent step coverage. Particularly, in the conventional CVD method, although a dielectric film having relatively good step coverage can be obtained by a deposition process utilizing a surface kinetic mode, reactants are simultaneously deposited onto the substrate. Thus, it is difficult to adjust step coverage in a specific portion as needed.

In particular, in a three-dimensional lower electrode having a rugged surface, excellent step coverage is difficult to obtain since the film deposited on a concavity formed by the rugged surface tends to be thin.

In a capacitor comprised of the lower electrode having a rugged surface, a greater electric potential acts upon an electrode portion having a smaller radius of curvature than upon a portion having a larger radius of curvature.

Generally, in a spherical capacitor formed in the capacitor having a rugged surface of the lower electrode, the electric potential is proportionate to the difference between radii of curvatures of two electrodes forming the capacitor, and is inversely proportionate to the product of the respective radii of curvatures. On the other hand, the capacitance is inversely proportionate to the difference between radii of curvatures of two electrodes forming the capacitor, and is regularly proportionate to the product of the respective radii of curvatures. Here, whereas the capacitance is affected by the overall area of the capacitor, the leakage current characteristic represented by the electric potential is determined by the weakest portion, i.e., an electrode surface portion having the smallest radius of curvature formed by the rugged surface. In other words, in the capacitor having a rugged surface of the lower electrode, a greater electric potential acts upon the portion having the smaller radius of curvature on the electrode surface than upon the portion having the larger radius of curvature, and thus more leakage current flows in the portion having the smaller radius of curvature than in the portion having the larger radius of curvature.

In the above description, the portions having the smaller radii of curvatures of the capacitor electrode means a plurality of concavities on the rugged surface of the lower electrode. These concavities are liable to cause a dielectric film to be formed thereon thinly, compared to convexities formed by the rugged surface when the dielectric film is formed by a conventional deposition method. When the dielectric film is to be formed, at a concavity having a small radius of curvature, thickly enough to prevent leakage current from increasing at a thin dielectric film portion due to the concentrated electric potential, a conventional method for forming a dielectric film unnecessarily increases the thickness at other dielectric film portions, thereby failing to obtain the desired capacitance.

As a result, according to the conventional method for forming a dielectric film, excellent step coverage is difficult to obtain. Although excellent step coverage could be obtained, increased leakage current at a concavity having a small radius of curvature cannot be overcome.

SUMMARY OF THE INVENTION

To solve the above problems, it is an objective of the present invention to provide a method for forming a dielectric film which can suppress leakage current generated at a portion of a capacitor having a rugged surface of a lower electrode where an electric potential acts strongly while capable of obtaining cell capacitance enough for device operation.

Accordingly, to achieve the above objective, there is provided a method for forming a dielectric film of a capacitor including the steps of (a) supplying a first reactant necessary for forming the dielectric film to the surface of a lower electrode having a convexity having a relatively large radius of curvature and a concavity having a relatively small radius of curvature formed thereon by a rugged surface, to form a chemisorption layer comprised of at least one atom of the first reactant chemically bonded on the surface of the lower electrode, and a physisorption layer comprised of at least one material of the first reactant physically bonded on the chemisorption layer, (b) partially removing the physisorption layer so that a residual physisorption layer is left on the chemisorption layer only on the concavity, and (c) reacting the chemisorption layer and the residual physisorption layer with a second reactant necessary for forming the dielectric film, to form a thin film having a greater thickness in the concavity than in the convexity, on the surface of the lower electrode.

Preferably, the dielectric film is a $Al_2O_3$ film. The first reactant is one selected from the group consisting of $Al(CH_3)_3$, $AlCl_3$, $AlH_3N(CH_3)_3$, $C_6H_{15}AlO$, $(C_4H_9)_2AlH$, $(CH_3)_2AlCl$, $(C_2H_5)_3Al$ and $(C_4H_9)_3Al$. The second reactant is one selected from the group consisting of the second reactant is one selected from the group consisting of $H_2O$, $N_2O$, $O_3$ and oxygen radical.

The physisorption layer is partially removed by a purging method using an inert gas or a pumping-out method.

The method for forming the dielectric film of a capacitor are repeated by a predetermined number of times, thereby obtaining the dielectric film having a desired thickness.

To form the thin film, the second reactant is supplied to the resultant structure from which the physisorption layer is partially removed, to cause a chemical reaction between the second reactant with the chemisorption layer and the residual physisorption layer, and the generated reaction byproducts are removed.

The reaction byproducts are removed by a purging method using an inert gas or by pumping.

To form an $Al_2O_3$ film as the dielectric film, the processing temperature is preferably 300° C. and the processing pressure is preferably in the range of 1–5 Torr.

According to the present invention, while cell capacitance enough for device operation can be obtained, increase in leakage current due to an electric potential strongly acting on a concavity having a small radius of curvature can be prevented.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1A:
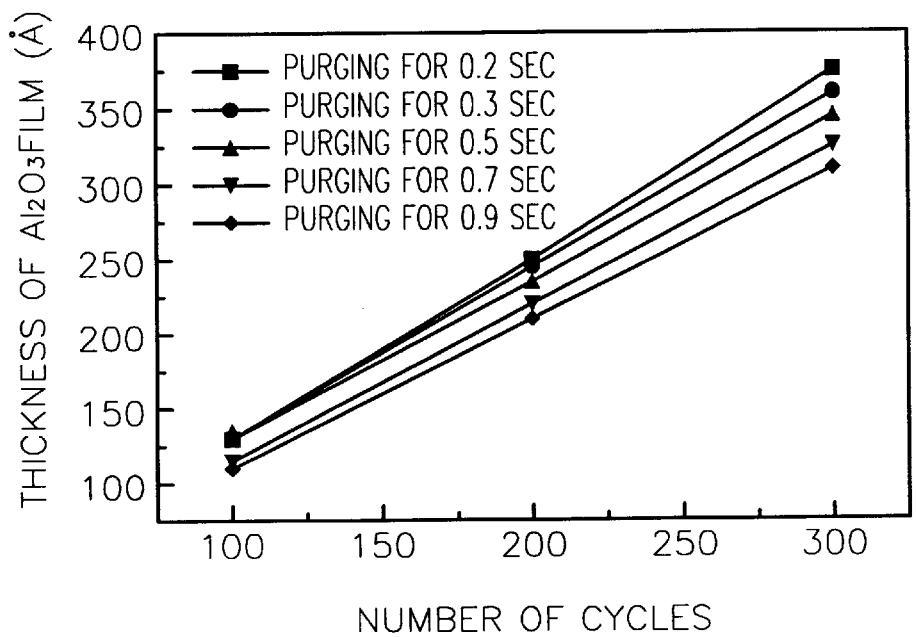
FIG. 1A is a graph illustrating the relationship between the number of processing cycles adopted for various cases of purging time when forming a dielectric film by an atomic layer deposition (ALD) method and the thickness of the dielectric film obtained therefrom.

A preferred embodiment of the present invention will now be described in more detail with reference to the accompanying drawings.

If a constant electric potential is present between the electrodes of a capacitor, the thicker the dielectric film gets, the less leakage current flows through the dielectric film. Thus, in the present invention, the dielectric film is selectively formed to be thicker only on a portion of the dielectric film of the capacitor, where there is a poor leakage current characteristic due to a greater electric potential than other portions, i.e., a concavity having a small radius of curvature on a lower electrode having a rugged surface, than other portions, thereby improving overall leakage current characteristics of the capacitor while obtaining sufficient capacitance required by the capacitor.

As described above, in the conventional CVD process using a surface kinetic mode, reactants necessary for deposition of the dielectric film are simultaneously deposited onto the substrate. Thus, it is difficult to adjust step coverage of a specific part as demanded.

However, in the present invention, an atomic layer deposition (ALD) method is performed where a high-purity dielectric film is formed by a plurality of atomic layers, so that various reactants necessary for deposition of the dielectric film are sequentially supplied to the substrate by a gas pulsing method. Here, the gas pulsing method implies a method of supplying a reaction gas and a purging gas alternately.

Generally, with the method for forming a thin film using the ALD method, the thickness of the film can be easily adjusted and excellent step coverage can be obtained. In the present invention, the reaction gases necessary for depositing the dielectric film are sequentially supplied to the substrate by the ALD method to form a chemisorption layer and a physisorption layer on the rugged surface of the lower electrode, and then purging time is adjusted to leave the physisorption layer in the concavity having a small radius of curvature on the surface of the lower electrode without being completely removed, thereby forming a thicker layer in the concavity having a small radius of curvature than in other portions. As a result, a dielectric film having perfect step coverage, i.e., 100%, can be formed on the convexity having a large radius of curvature, on the surface of the lower electrode, and a dielectric film having a step coverage larger than 100% by increased thickness can be formed on the concavity having a small radius of curvature. Since the dielectric film having increased thickness is formed on the concavity having a small radius of curvature, the leakage current can be prevented from increasing due to the electric potential acting strongly upon the concavity having a small radius of curvature.

"Step coverage" expressed throughout the specification is defined as the percentage of the thickness (d1) of a thin film formed on the concavity to the thickness (d2) of a thin film formed on the convexity, i.e., (d1/d2)X100, in thin films formed on an underlying layer having a three-dimensional surface by concavities and convexities.

The present invention can adopt any deposition method where steps of periodically supplying various reactants and purging the same are repeatedly performed, such as cyclic CVD, digital CVD or advanced CVD as well as the ALD method.

For the convenience, the method for forming a dielectric film by the ALD method will be described in this embodiment. The invention can adopt any of the above-described methods.

In the present invention, in order to form a dielectric film having an increased thickness at a specific portion, a method for reducing a purging efficiency in the ALD method is used. When the thickness of the dielectric film formed by this ALD method is partially increased, the relatively thick portion may contain some impurities if the purging efficiency is poor in the vicinity of the relatively thick portion. However, the concentration of the impurities in the relatively thick portion is too low to affect the properties of the dielectric film. Such is substantiated by the following tests.

FIG. 1A is a graph illustrating the relationship between the number of processing cycles adopted for various cases of purging time when forming a dielectric film by the ALD method and the thickness of the dielectric film obtained therefrom.

In detail, when a dielectric film, i.e., $Al_2O_3$ film, is formed by the ALD method, $Al(CH_3)_3$ gas was supplied to the lower electrode to induce a chemisorptive state and a physisorptive state. Then, thicknesses of the formed $Al_2O_3$ film were measured while increasing the number of processing cycles adopted for forming the dielectric film, with the purging time being set to 0.2 second, 0.3 second, 0.5 second, 0.7 second and 0.9 second, respectively.

From the results shown in FIG. 1A, it was found that the thickness of the $Al_2O_3$ film had a linear relationship with the number of processing cycles adopted by the ALD process in all cases of purging time adopted. In other words, irrespective of the purging time, the thickness of the $Al_2O_3$ film increases in proportional to the number of cycles of the ALD process.

Figure 1B:
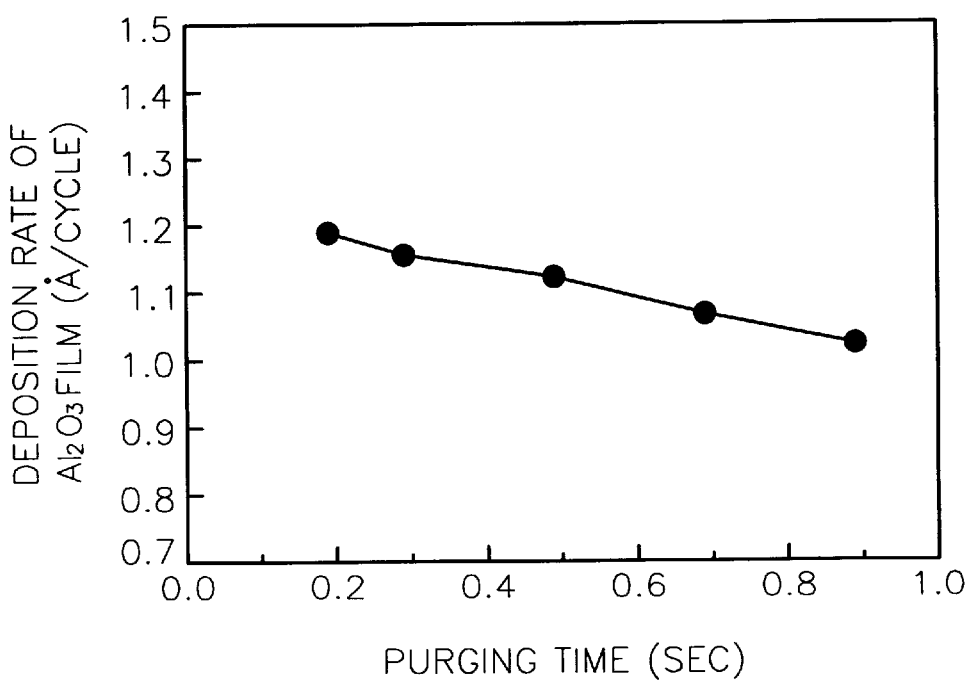
FIG. 1B is a graph illustrating the relationship between the purging time and the deposition rate of an $Al_2O_3$ film.

FIG. 1B is a graph illustrating the relationship between the purging time and the thickness of the $Al_2O_3$ film deposited for each processing cycle, i.e., the deposition rate of the $Al_2O_3$ film.

From the results shown in FIG. 1B, it was found that the deposition rate of the $Al_2O_3$ film was decreased as the purging time increased. In detail, the $Al_2O_3$ film was deposited to a thickness of 1.21 Å for one processing cycle in the case of purging for 0.2 second, and the $Al_2O_3$ film was deposited to a thickness of 1.028 Å for one processing cycle in the case of purging for 0.9 second. That is to say, the deposition rate for 0.2 second purging time was increased 17% in comparison with that for 0.9 second purging time.

Figure 2:
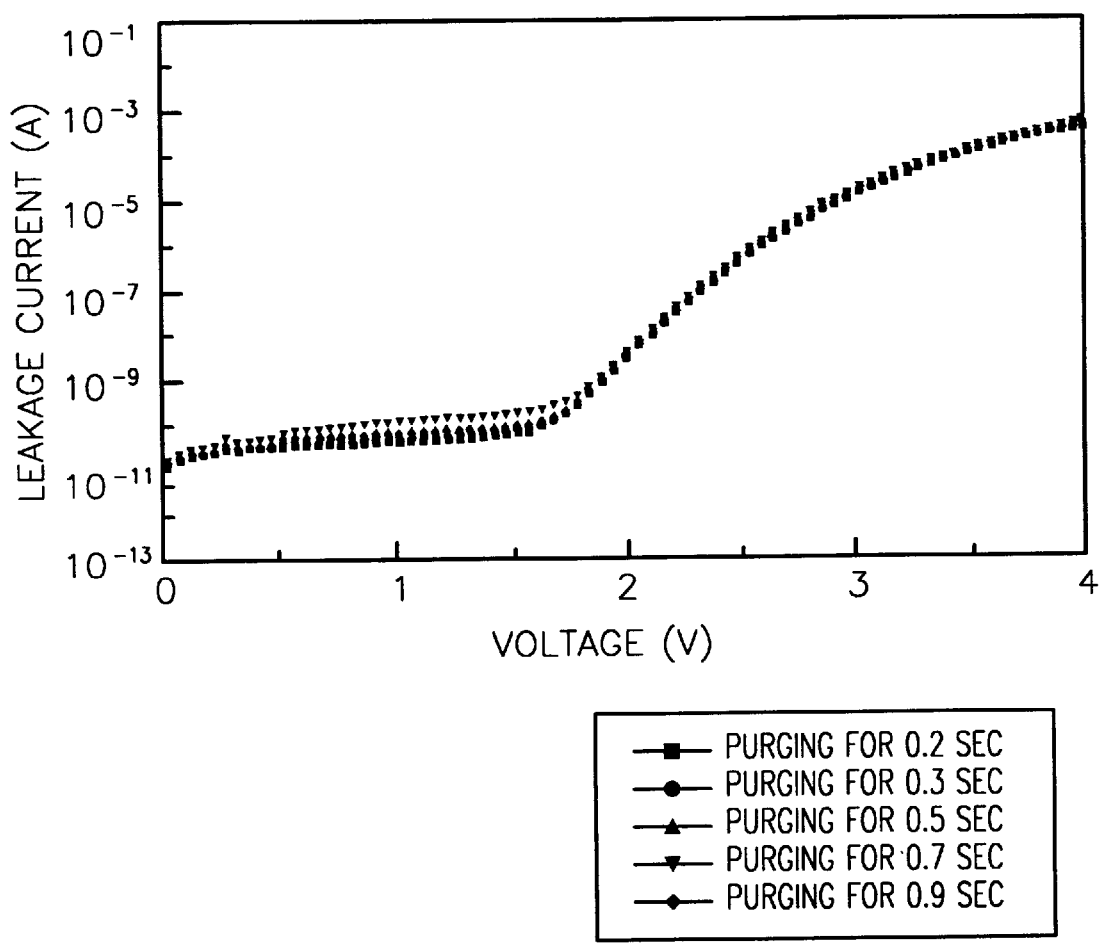
FIG. 2 is a graph illustrating the leakage current characteristics of capacitors when dielectric films of the capacitors are formed by the ALD method by adopting various cases of purging time.

FIG. 2 is a graph illustrating the leakage current characteristics of capacitors when dielectric films of the capacitors are formed by the ALD method by adopting various cases of purging time.

FIG. 2 shows the result of measuring leakage currents of samples with dielectric films formed by adopting various cases of purging time with respect to a simple stacked capacitor comprised of a lower electrode made of polysilicon, a dielectric film made of $Al_2O_3$ having a thickness of 70±1 Å, an upper electrode made of polysilicon. In other words, since all samples have the dielectric films having the same thickness, their equivalent oxides have the same thickness and their leakage current characteristics are the substantially same.

From the results shown in FIG. 2, it was found that there was little change in the electrical characteristics of the dielectric film depending on the change in purging time.

In the present invention, based on the above-described experimental results, the thickness of the dielectric film is increased at a specific part by changing the purging time when forming the dielectric film by the ALD method. In other words, in the present invention, the thickness of the dielectric film is increased at a portion where the electric potential is large due to a three-dimensional shape of the lower electrode like the concavity having a small radius of curvature formed on the rugged surface of the lower electrode, thereby preventing the leakage current from increasing at the portion having a large electric potential.

The present invention is not limited to the following embodiments and may be implemented in various forms. These embodiments are only provided to make the disclosure of the invention complete and make those who have ordinary skills in the art know the scope of the invention. Throughout the drawings, components of various devices and thicknesses of various films and regions are emphasized for clarity. In the accompanying drawings, the same elements are designated by the same numbers. Also, when a layer is said to exist on another layer or a substrate, the layer may exist directly on another layer or substrate, or a third layer may be present therebetween.

Figure 3A:
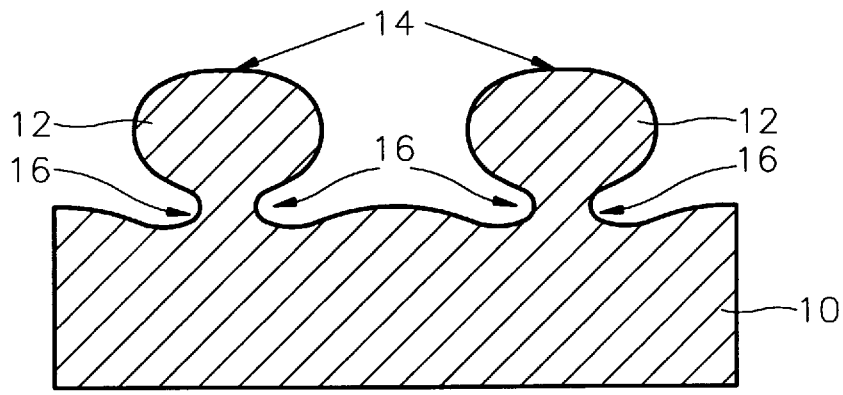
FIGS. 3A through 3E are cross-sectional views illustrating a method for forming a dielectric film of a capacitor according to a preferred embodiment of the present invention.
Figure 3B:
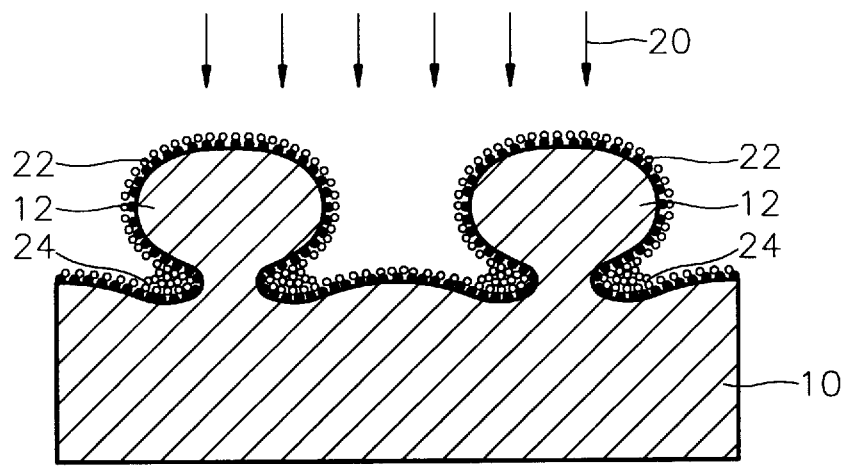
Figure 3C:
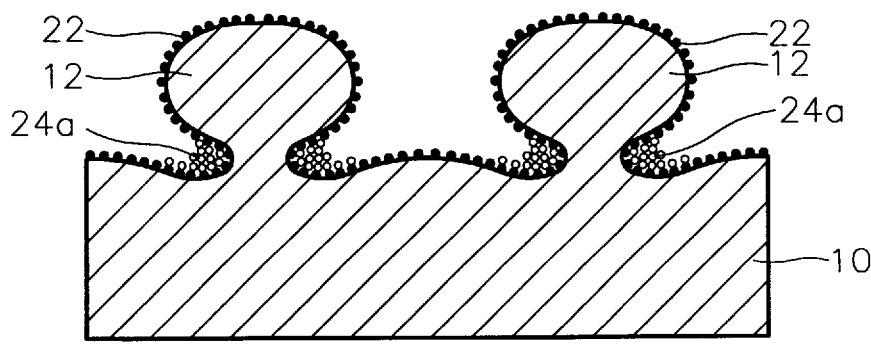
Figure 3D:
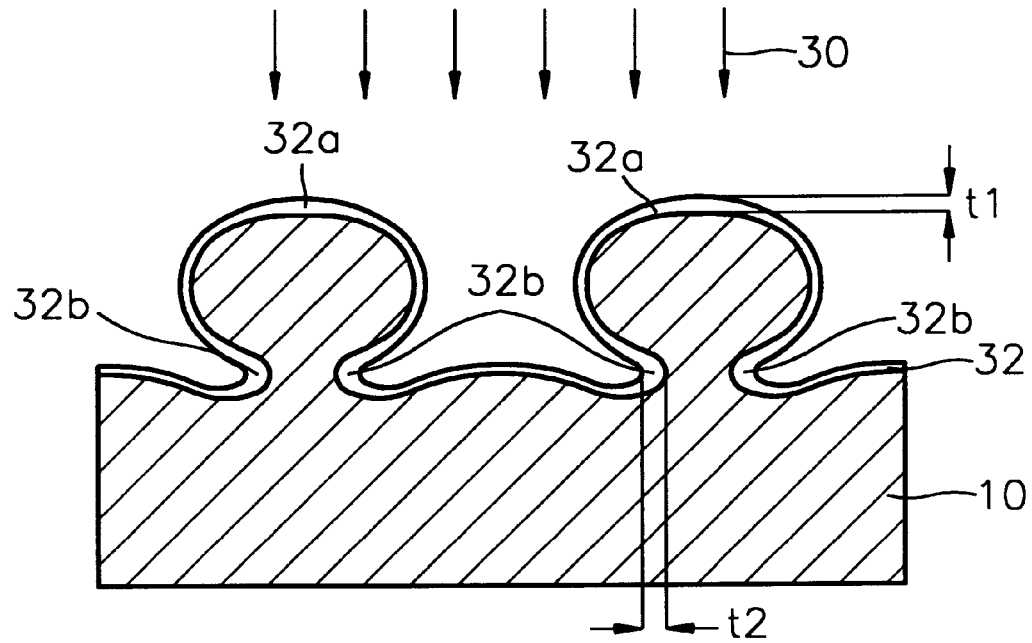
Figure 3E:
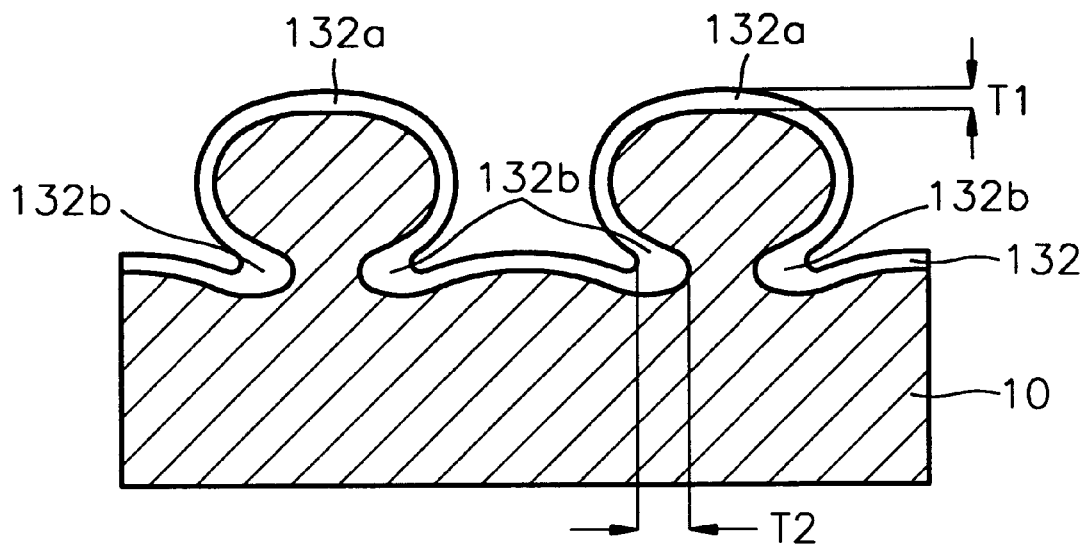
Figure 4:
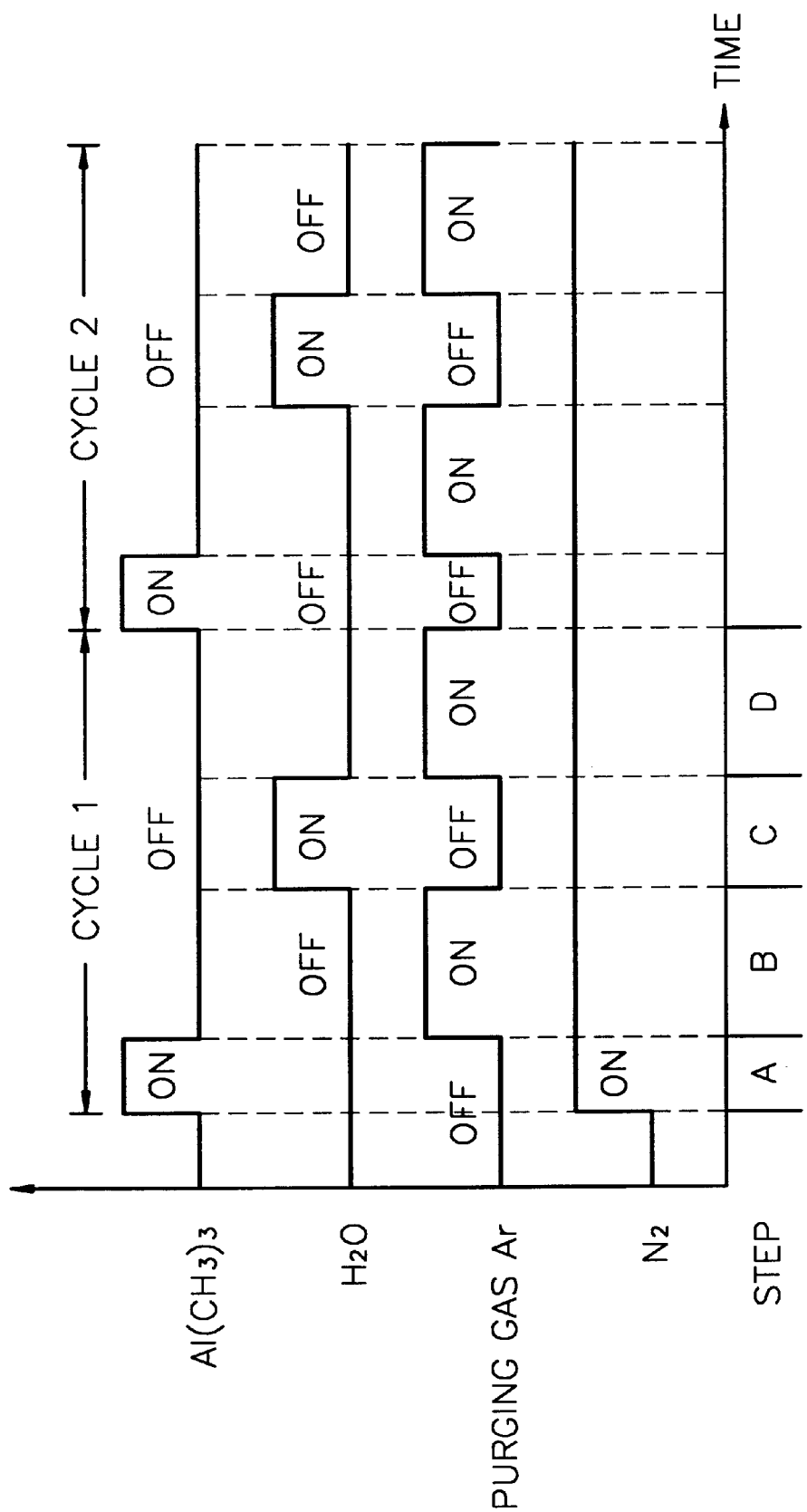
FIG. 4 is a timing diagram for explaining a gas pulsing method adoptable to the method for forming a dielectric film of a capacitor according to a preferred embodiment of the present invention.

FIGS. 3A through 3E and FIG. 4 are diagrams illustrating a method for forming a dielectric film of a capacitor according to a preferred embodiment of the present invention. In detail, FIGS. 3A through 3E are partial cross-sectional views of a lower electrode 10, illustrating a sequence of steps of the method for forming a dielectric film on the surface of the lower electrode 10 having a rugged surface, according to the present invention, and FIG. 4 is a timing diagram for explaining a gas pulsing method adoptable to the method for forming a dielectric film of a capacitor according to a preferred embodiment of the present invention.

Referring to FIG. 3A, in order to form a capacitor of a semiconductor device, first, the lower electrode 10 made of polysilicon and having a rugged surface is formed on a substrate (not shown). A convexity 14 having a relatively large radius of curvature and a concavity 16 having a relatively small radius of curvature are formed on the surface of the lower electrode 10 by grains 12.

Referring to FIG. 3B, in order to form a dielectric film comprised of an $Al_2O_3$ film on the surface of the lower electrode 10 by the ALD method, using $Al(CH_3)_3$ as a first reactant and $H_2O$ gas as a second reactant, first, $Al(CH_3)_3$ gas 20, i.e., a first reactant, is supplied to the surface of the lower electrode 10. Here, Ar is used as a carrier gas of the $Al(CH_3)_3$ gas. Further, the first reactant can be one selected from the group consisting of $AlCl_3$, $AlH_3N(CH_3)_3$, $C_6H_{15}AlO$, $(C_4H_9)_2AlH$, $(CH_3)_2AlCl$, $(C_2H_5)_3Al$ and $(C_4H_9)_3Al$. Also, the second reactant can be one selected from the group consisting of $N_2O$, $O_3$ and oxygen radical. The processing pressure is in the range of 1–5 Torr.

As in step A shown in FIG. 4, while $N_2$ gas as an atmospheric gas is constantly supplied at a flow rate of 400 sccm, the $Al(CH_3)_3$ gas 20 is supplied at a flow rate of 200 sccm for 0.3 second. Here the $N_2$ gas used as an atmospheric gas serves to dilute the $Al(CH_3)_3$ gas 20 supplied to the surface of the lower electrode 10 to a desired concentration.

As a result, a chemisorption layer 22 (represented by black particles in FIG. 3B) comprised of Al atoms obtained from the $Al(CH_3)_3$ gas 20 and a physisorption layer 24 (represented by white particles in FIG. 3B) formed by a relatively weak physical bond on the chemisorption layer 22 are formed on the surface of the lower electrode 10.

Referring to FIG. 3C, the resultant structure shown in FIG. 3B is purged using an inert gas as a purging gas to remove only a portion of the physisorption layer 24. In other words, the physisorption layer 24 formed in a region other than the concavity 16 having a small radius of curvature is removed, and a residual layer 24a of the physisorption layer 24 is left on the chemisorption layer 22 formed on the concavity 16.

To this end, as in step B shown in FIG. 4, Ar gas as a purging gas is supplied at a flow rate of 200 sccm for 0.6 second. Here, to strengthen the function of the Ar gas as the purging gas, $N_2$ gas is supplied at a flow rate of 400 sccm together.

Here, in order to remove the overall physisorption layer 24 from the resultant structure shown in FIG. 3B like in the conventional ALD process, the purging process must be performed for 0.9 second in the step B shown in FIG. 4. However, according to the presents invention, the purging process is performed until the physisorption layer 24 is left only on the concavity 16 from which the physisorption layer 24 is removed relatively slowly. In this embodiment, the purging process is performed for 0.6 second so that the residual layer of the. physisorption layer 24 is left on the concavity 16.

Although it has been described through the above-described embodiment that the purging process was performed to remove the physisorption layer 24 partially, it is possible to remove the physisorption layer 24 partially by a pumping-out process.

Referring to FIG. 3D, $H_2O$ gas 30 as a second reactant is supplied to the resultant structure having the chemisorption layer 22 and the residual layer 24a of the physisorption layer 24 at the processing temperature of 20–700° C. and under the processing pressure of 1E-05–100 Torr, using Ar as a carrier gas.

Here, as in step C shown in FIG. 4, while $N_2$ gas as an atmospheric gas is constantly supplied at a flow rate of 400 sccm, the $H_2O$ gas 30 is supplied at a flow rate of 200 sccm for 0.5 second. Here, the $N_2$ gas used as an atmospheric gas serves to dilute the $H_2O$ gas 30.

As a result, oxygen atoms forming the $H_2O$ gas 30 causes chemical reaction with the chemisorption layer 22 and the residual layer 24a of the physisorption layer 24 so that a thin film 32 comprised of $Al_2O_3$ is formed on the surface of the lower electrode 10. Here, since only the chemisorption layer 22 is formed on the convexity 14 having a relatively large radius of curvature on the surface of the lower electrode 10, a thin film 32a comprised of pure $Al_2O_3$ and having a relatively small thickness (t1) is formed on the convexity 14. On the other hand, since the chemisorption layer 22 and the residual layer 24a of the physisorption layer 24 are formed on the concavity 16 having a relatively small radius of curvature, both the chemisorption layer 22 and the residual layer 24a of the physisorption layer 24 are involved in formation of the thin film 32. As a result, a thin film 32b having a relatively large thickness (t2) is formed on the concavity 16. The thin film 32b having a relatively large thickness (t2) may contain some impurities by the residual layer 24a of the physisorption layer 24. However, in the present invention, the content of the impurities can be controlled so as not to affect the properties of the dielectric film, by adjusting the purging time as shown in FIG. 3C.

Thereafter, the resultant structure having the thin film 32 is purged using an inert gas as a purging gas to remove all reaction byproducts left after the thin film 32 is formed.

To this end, as in step D shown in FIG. 4, Ar gas as a purging gas is supplied at a flow rate of 200 sccm for 0.6 second. Here, to strengthen the function of the Ar gas as the purging gas, $N_2$ gas is supplied at a flow rate of 400 sccm together.

Although it has been described through the above-described embodiment that the purging process was performed to remove the reaction byproducts, it is possible to remove the reaction byproducts by a pumping-out process.

Thus, a one-cycle process comprised of the steps A through D shown in FIG. 4 is completed.

Referring to FIG. 3E, while repeating several times gas pulsing cycles shown in FIG. 4 on the resultant structure having the thin film 32, the processes described referring to FIGS. 3B through 3D are repeated several times to form a dielectric film 132 comprised of $Al_2O_3$ to a desired thickness, e.g., 60 Å.

The dielectric film 132 includes a dielectric film 132a formed on the convexity 14 having a relatively large radius of curvature and having a relatively small thickness T1 and a dielectric film 132b formed on the concavity 16 having a relatively small radius of curvature and having a relatively large thickness T2. Thus, the step coverage of the dielectric film 132b deposited on the concavity 16 exceeds 100%.

Figure 5:
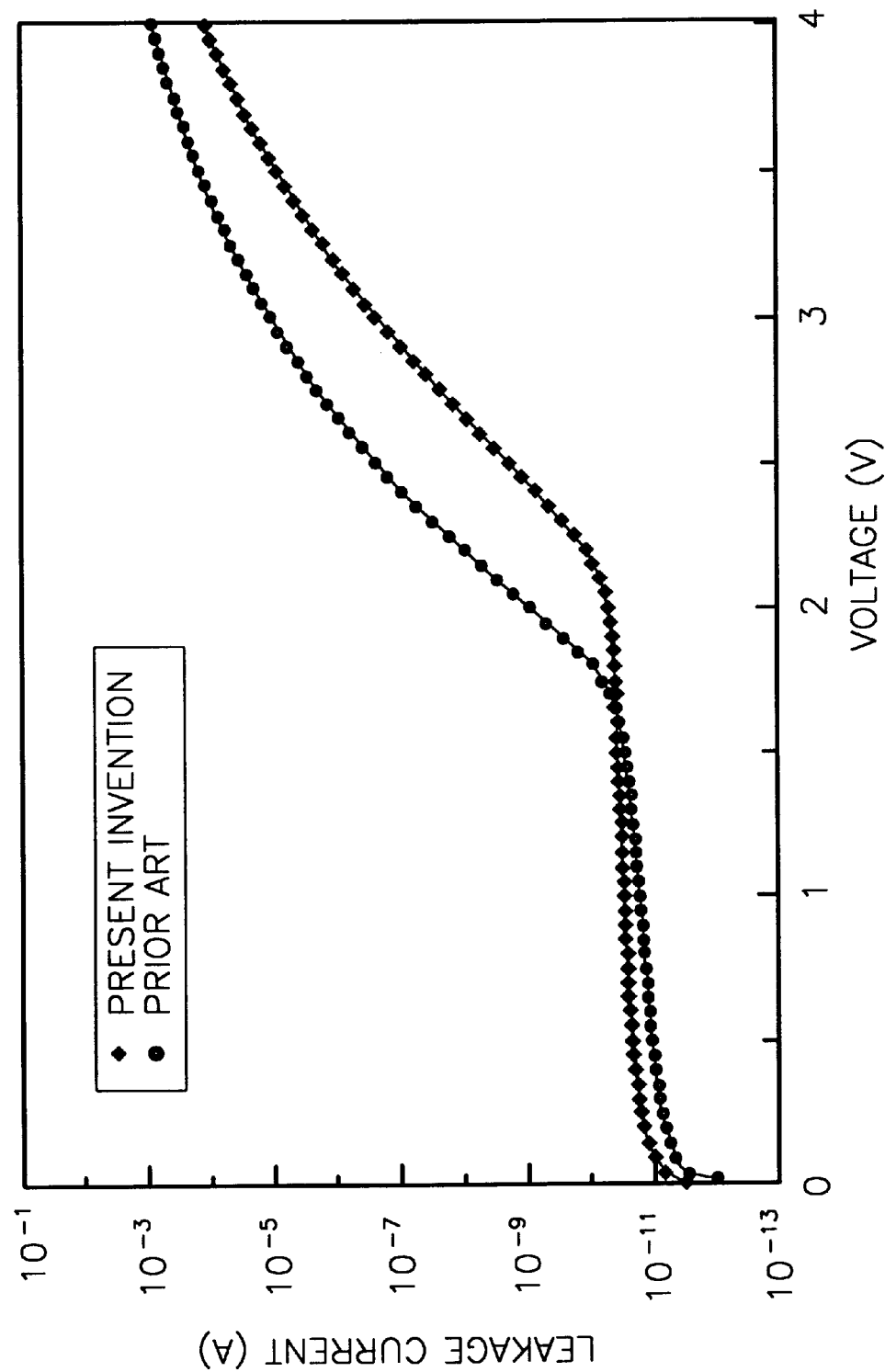
FIG. 5 is a graph for comparing the leakage current characteristics of the present invention and the prior art.

FIG. 5 is a graph for comparing the leakage current characteristics of the present invention and the prior art.

In more detail, FIG. 5 illustrates the leakage current characteristics of capacitors whose equivalent oxides have the same thickness, in the case of forming a dielectric film having step coverage greater than 100% because the thickness of the dielectric film formed on the concavity having a relatively small radius of curvature is larger than that of the dielectric film formed on the convexity having a relatively large radius of curvature, on the lower electrode having a rugged surface according to the present invention, which is indicated by (♦) in the drawing, and the case of forming a dielectric film having step coverage of 100% on every part of the lower electrode having a rugged surface, according to the prior art, which is indicated by (●) in the drawing.

From the results shown in FIG. 5, it was understood that the leakage current characteristics in the case of forming the dielectric film according to the present invention has improved compared to the conventional case.

This means that increase in the leakage current by the electric potential acting more strongly on a portion having a smaller radius of curvature than other portions of the dielectric film of the capacitor, is suppressed by making the dielectric film formed on the concavity having a small radius of curvature thicker than that formed on the convexity having a large radius of curvature, according to the present invention.

Although it has been described in the above-described embodiment that the $Al_2O_3$ film was formed as the dielectric film of the capacitor, the present invention is not limited thereto and may be applied to deposition of another oxide or nitride. For example, the method according to the present invention can be applied to formation of a monatomic oxide such as $TiO_2$, $ZrO_2$, $HfO_2$, $Ta_2O_5$, $Nb_2O_5$, $CeO_2$, $Y_2O_3$, $SiO_2$, $In_2O_3$, $RuO_2$ or $IrO_2$; a complex oxide such as $SrTiO_3$, $PbTiO_3$, $SrRuO_3$, $CaRuO_3$, $(Ba, Sr)TiO_3$, $Pb(Zr, Ti)O_3$, $(Pb, La) (Zr, Ti)O_3$, $(Sr, Ca)RuO_3$, $(Ba, Sr)RuO_3$, $In_2O_3$ (ITO) doped with Sn, $In_2O_3$ doped with F or $In_2O_3$ doped with Zr; a monatomic nitride such as SiN, NbN, ZrN, TiN, TaN, $Ya_3N_5$, AlN, GaN, WN or BN; and a complex nitride such as WBN, WSiN, TiSiN, TaSiN, AlSiN or AlTiN.

As described above, according to the present invention, using a deposition method by a gas pulsing method, a dielectric film having step coverage of 100% is formed on the convexity having a large radius of curvature on the surface of the lower electrode and a dielectric film having step coverage of greater than 100% is formed on the concavity having a small radius of curvature by making the dielectric film thicker in the concavity than in other portions. Thus, while cell capacitance enough for device operation can be obtained, increase in leakage current due to an electric potential strongly acting on a concavity having a small radius of curvature can be prevented.

Although the present invention has been described with reference to specific embodiments, the invention is not limited thereto and various alterations and modifications may be made by one skilled in the art within the spirit and scope of the invention.

What is claimed is:

1. A method for forming a dielectric film in a capacitor comprising the steps of:
   (a) providing a lower electrode having a surface and a rounded protruding portion, said surface and said protruding portion defining at least one concave area;
   (b) forming a chemisorption layer comprised of at least one atom of the first reactant chemically bonded to the surface of the lower electrode, and a physisorption layer comprised of at least one material of the first reactant physically bonded to the chemisorption layer;

(c) removing a portion of the physisorption layer, leaving a portion of the physisorption layer on the concave area; and (d) reacting the chemisorption layer and the portion of the physisorption layer on the concave area with a second reactant to form a dielectric film on the surface of the lower electrode, wherein the thickness of said dielectric film is greater on the concave area than on the protruding portion.

2. The method according to claim 1, wherein the first reactant is $Al(CH_3)_3$, wherein the second reactant is $H_2O$, and wherein the dielectric film is a $Al_2O_3$ film.

3. The method according to claim 1, wherein in step (c), the physisorption layer is partially removed by a purging method using an inert gas.

4. The method according to claim 1, wherein in the step (c), the physisorption layer is partially removed by a pumping-out method.

5. The method according to claim 1, wherein the steps (b) through (d) are repeated by a predetermined number of times until the dielectric film is formed to a desired thickness.

6. The method according to claim 1, wherein the step (d) comprises the sub-steps of:

(d-1) supplying the second reactant to the resultant structure from which the physisorption layer is partially removed, to cause a chemical reaction between the second reactant with the chemisorption layer and the portion of the physisorption layer; and (d-2) removing reaction byproducts generated in the step (d-1).

7. The method according to claim 6, wherein in the step (d-2), the reaction byproducts are removed by a purging method using an inert gas.

8. The method according to claim 6, wherein in the step (d-2), the reaction byproducts are removed by a pumping-out method.

9. The method according to claim 2, wherein the steps (a) through (d) are performed at a temperature of 300° C.

10. The method according to claim 2, wherein the steps (a) through (d) are performed under the pressure in the range of 1–5 Torr.

11. The method according to claim 1, wherein the dielectric film is formed of a monatomic oxide selected from the group consisting of $TiO_2$, $ZrO_2$, $HfO_2$, $Ta_2O_5$, $Nb_2O_5$, $CeO_2$, $Y_2O_3$, $SiO_2$, $In_2O_3$, $RuO_2$, and $IrO_2$.

12. The method according to claim 1, wherein the dielectric film is formed of a complex oxide selected from the group consisting of $SrTiO_3$, $PbTiO_3$, $SrRuO_3$, $CaRuO_3$, $(Ba, Sr)TiO_3$, $Pb(Zr, Ti)O_3$, $(Pb, La)(Zr, Ti)O_3$, $(Sr, Ca)RuO_3$, $(Ba, Sr)RuO_3$, $I_2O_3$ (ITO) doped with Sn, $In_2O_3$ doped with F, and $In_2O_3$ doped with Zr.

13. The method according to claim 1, wherein the dielectric film is formed of a monatomic nitride selected from the group consisting of SiN, NbN, ZrN, TiN, TaN, $Ya_3N_5$, AlN, GaN, WN, and BN.

14. The method according to claim 1, wherein the dielectric film is formed of a complex nitride selected from the group consisting of WBN, WSiN, TiSiN, TaSiN, AlSiN, and AlTiN.

15. The method according to claim 1, wherein the dielectric film is formed by two or more reactants.

16. The method according to claim 1, wherein the first reactant is one selected from the group consisting of $Al(CH_3)_3$, $AlCl_3$, $AlH_3N(CH_3)_3$, $C_6H_{15}AlO$, $(C_4H_9)_2AlH$, $(CH_3)_2AlCl$, $(C_2H_5)_3Al$ and $(C_4H_9)_3Al$, and the second reactant is one selected from the group consisting of $H_2O$, $N_2O$, $O_3$ and oxygen radical.

* * * * *

UNITED STATES PATENT AND TRADEMARK OFFICE
CERTIFICATE OF CORRECTION

PATENT NO.   : 6,207,487 B1                                             Page 1 of 1
DATED        : March 27, 2001
INVENTOR(S)  : Yeong-Kwan Kim et al.

It is certified that error appears in the above-identified patent and that said Letters Patent is hereby corrected as shown below:

Column 6,
Line 66, "the. physisorption" should read -- the physisorption --;

Column 8,
Line 38, "AIN" should read -- A1N --;

Column 10,
Line 16, "I$_2$O$_3$" should read -- In$_2$O$_3$ --;
Line 19, "AIN" should read -- A1N --.

Signed and Sealed this

Twenty-eighth Day of January, 2003

JAMES E. ROGAN
*Director of the United States Patent and Trademark Office*